United States Patent [19]
Mehta et al.

[11] Patent Number: 6,166,428
[45] Date of Patent: Dec. 26, 2000

[54] FORMATION OF A BARRIER LAYER FOR TUNGSTEN DAMASCENE INTERCONNECTS BY NITROGEN IMPLANTATION OF AMORPHOUS SILICON OR POLYSILICON

[75] Inventors: Sunil D. Mehta, San Jose; William G. En, Sunnyvale; Darin Arthur Chan, Campbell; Raymond Takling Lee, Sunnyvale, all of Calif.

[73] Assignee: Advanced Micro Devices, Inc., Sunnyvale, Calif.

[21] Appl. No.: 08/917,153

[22] Filed: Aug. 25, 1997

[51] Int. Cl.$^7$ ...................................................... H01L 23/58
[52] U.S. Cl. .......................... 257/636; 257/646; 257/315
[58] Field of Search .................................... 257/646, 636, 257/315

[56] References Cited

U.S. PATENT DOCUMENTS

| | | | |
|---|---|---|---|
| 5,492,865 | 2/1996 | Nariani et al. | 438/453 |
| 5,518,936 | 5/1996 | Yamamoto et al. | 437/24 |
| 5,682,052 | 10/1997 | Hodges et al. | 257/377 |
| 5,763,937 | 6/1998 | Jain et al. | 257/646 |
| 5,825,068 | 10/1998 | Yang | 257/380 |
| 5,905,298 | 5/1999 | Watatani | 257/635 |

OTHER PUBLICATIONS

R.C.Sun, J.T. Clemens and J.T.Nelson, "Effects of Silicon Nitride Encapulation of MOS Device Stablility," 1980 IEEE (No Month Given).

J. Givens, S. Geissler, O.Cain, W.Clark, C. Koburger, J.Lee, "A Low–Temperature Local Interconnect Process in a 0.25–micrometer–channel CMOS Logic Technology with Shallow Trench Isolation," Jun. 7–8, 1994 VMIC Conference 1994 ISMIC–103/94/0043.

*Primary Examiner*—Mahshid Saadat
*Assistant Examiner*—Allan R. Wilson
*Attorney, Agent, or Firm*—H. Donald Nelson

[57] ABSTRACT

A semiconductor device having at least a first and second type of devices formed in the substrate of the semiconductor device and having a hydrogen free barrier layer formed by implanting nitrogen into a layer of amorphous silicon or polysilicon formed on the surface of the semiconductor device. A hydrogen getter layer is formed on the semiconductor device under the barrier layer. The hydrogen getter layer is removed from portions of the semiconductor device on which salicide layers are to be formed.

12 Claims, 13 Drawing Sheets

FORMATION OF A BARRIER LAYER FOR TUNGSTEN DAMASCENE INTERCONNECTS BY NITROGEN IMPLANTATION OF AMORPHOUS SILICON OR POLYSILICON

CROSS REFERENCE TO RELATED APPLICATIONS

This application is related to application Ser. No. 08/805,119, filed on Feb. 24, 1997, entitled SEMICONDUCTOR DEVICES WITH TUNGSTEN DAMASCENE LOCAL INTERCONNECTS HAVING A HYDROGEN GETTER LAYER AND A LOW HYDROGEN CONTENT LI ETCH STOP LAYER, application Ser. No. 08/918,244, now U.S. Pat. No. 6,060,766, filed on the filing date of this application, entitled PROTECTION OF HYDROGEN SENSITIVE REGIONS IN SEMICONDUCTOR DEVICE FROM THE POSITIVE CHARGE ASSOCIATED WITH PLASMA DEPOSITED BARRIERS OR LAYERS, and application Ser. No. 08/917,149, now U.S. Pat. No. 5,940,735 filed on the filing date of this application, entitled REDUCTION OF CHARGE LOSS IN NON-VOLATILE MEMORY CELLS BY PHOSPHORUS IMPLANTATION INTO PECVD NITRIDE/OXYNITRIDE FILMS. The above applications are assigned to the assignee of this application.

BACKGROUND OF THE INVENTION

1. Field of the Invention

This invention relates generally to high performance semiconductor devices with a barrier layer formed of a layer of amorphous silicon or polysilicon implanted with nitrogen. More specifically, this invention relates to high performance semiconductor devices with a barrier layer formed of a layer or amorphous silicon or polysilicon implanted with nitrogen and having a hydrogen getter layer formed under the barrier layer.

2. Discussion of the Related Art

The semiconductor industry is characterized by the dual requirements of an increase in the speed of integrated circuits and an increase in the density of elements in those integrated circuits. These two requirements have thus become the two major goals of the design engineers in their design and manufacturing efforts concerned with MOSFETs and other semiconductor devices, such as volatile and non-volatile memory devices. Increasing the density of elements in integrated circuits means that smaller channel lengths and widths have to be used. As the dimensions of semiconductor devices decreased, the existing "long-channel" performance models for MOSFET devices predicted that the decrease in the channel length, L, or the gate oxide thickness, $T_{ox}$, would increase $I_{DSAT}$. However, as MOSFET devices were scaled below approximately 2 $\mu$m, effects not predicted by the existing long channel models were observed and the unexpected effects were thereafter termed "short-channel" effects.

As device dimensions of MOSFETs continued to decrease, it was determined that problems associated with the short-channel effects could be placed in two general categories: (1) the problem of increased leakage current when the MOSFET is off and (2) reliability problems associated with short-channel and thin gate oxide device structures.

Some of the reliability problems that arise in short-channel and thin gate oxide MOSFETs include; (1) thin gate oxide breakdown, (2) device degradation due to hot-carrier effects, (3) reliability problems associated with intercon- nects between MOSFETs and (4) reliability problems associated with local interconnects. One of the major problems associated with semiconductor devices other than MOSFETs involves high-temperature data retention in nonvolatile memory cells. The two problems that are of particular interest are device degradation due to hot-carrier effects and high-temperature data retention problems in nonvolatile memory cells.

It has been observed that there are high-temperature data retention problems in nonvolatile memory cell arrays such as EPROMs, FLASH EPROMs, and $E^2$PROMs. It has been postulated that the poor high-temperature data retention is due to mobile hydrogen atoms that diffuse to the floating gate in a nonvolatile memory cell and cause the charge on the floating gate to be lost.

The reduced memory cell size and high-performance logic circuits has necessitated the use of borderless contacts and local interconnects. The borderless contacts and local interconnects have required the use of a barrier layer such as an etch stop layer or diffusion protect layer. The prior art developed a low-temperature, damascene-tungsten local interconnect for a 0.25 $\mu$m channel CMOS technology with trench isolation. One such prior art structure is described in "A Low-Temperature Local Interconnect Process in a 0.25-$\mu$m-channel CMOS Logic Technology with Shallow Trench Isolation," by J. Givens, S. Geissler, O. Cain, W. Clark, C Koburger, J. Lee, 1994 VMIC Conference. However, the prior art includes the use of silicon nitride films that have high hydrogen content. The high hydrogen content has caused problems as described in the article "Effects of Silicon Nitride Encapsulation on MOS Device Stability," by R. C. Sun, J. T. Clemens and J. T. Nelson, IEEE 1980. This article describes a new threshold instability phenomenon observed in MOS transistors encapsulated with plasma deposited silicon nitride films and describes a series of experiments which indicated that the instability was due to a chemical effect associated with hydrogen in the silicon nitride films. The article postulated that the formation of surface states and fixed charges in the channel region was due to the interaction of hot carriers with hydrogen present at the interface and was the basic mechanism causing the instability.

Therefore, what is needed are semiconductor devices that have low amounts of free hydrogen and methods of manufacturing such low hydrogen content semiconductor devices.

SUMMARY OF THE INVENTION

The present invention is directed to a semiconductor device having at least one type of device formed in a semiconductor substrate and a barrier layer formed by implanting nitrogen into a layer of amorphous silicon or polysilicon. The present invention is further directed to a semiconductor device having at least a second type of device formed in the semiconductor substrate with the barrier layer formed over the at least the second type of device.

The present invention is further directed to semiconductor device having a hydrogen getter layer formed under the barrier layer. The hydrogen getter layer is selected from a group including a PSG film, a BPSG film, a PTEOS deposited oxide film, and a BPTEOS deposited oxide film. The hydrogen getter layer has a thickness of approximately 1000–2000 Angstroms. The hydrogen getter layer is removed from selected portions of the semiconductor device on which salicide layers are to be formed and salicide layers are then formed on the selected portions.

The present invention is also directed to semiconductor devices having tungsten damascene interconnects.

The present invention is further directed to a method of manufacturing semiconductor devices having a barrier layer formed by implanting nitrogen into a layer of amorphous silicon or polysilicon The method of the present invention includes forming a hydrogen getter layer under the barrier layer. The hydrogen getter layer is selected from a group including a PSG film, a BPSG film, a PTEOS deposited oxide film, and a BPTEOS deposited oxide film. The hydrogen getter layer is formed with a thickness of approximately 1000–2000 Angstroms.

The present invention is better understood upon consideration of the detailed description below, in conjunction with the accompanying drawings. As will become readily apparent to those skilled in the art from the following description there is shown and described embodiments of this invention simply by way of illustration of the best modes to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings:

FIGS. 1A–1D also illustrate selected steps in a method of manufacturing the semiconductor device.

FIGS. 2E–2G show the barrier layer removed from over the floating gate. FIGS. 2A–2G also illustrate selected steps in a method of manufacturing the semiconductor device.

FIGS. 3A–3I also illustrate selected steps in a method of manufacturing the semiconductor device.

FIGS. 4A–4L also illustrate selected steps in a method of manufacturing the semiconductor device.

FIGS. 5A–5J also illustrate selected steps in a method of manufacturing the semiconductor device.

DETAILED DESCRIPTION

Reference is now made in detail to specific embodiments of the present invention that illustrate the best modes presently contemplated by the inventors for practicing the invention. The structure of three devices and the method of manufacturing the three devices are described in detail and it should be understood that the three devices could be manufactured on the same semiconductor chip at the same time. The use of selected masking steps during the manufacture of the semiconductor chip results in the differences in structure of the three devices. Therefore, some of the layers described in conjunction with one device are the same layers described in conjunction with one or both of the other described devices.

Figure 1:
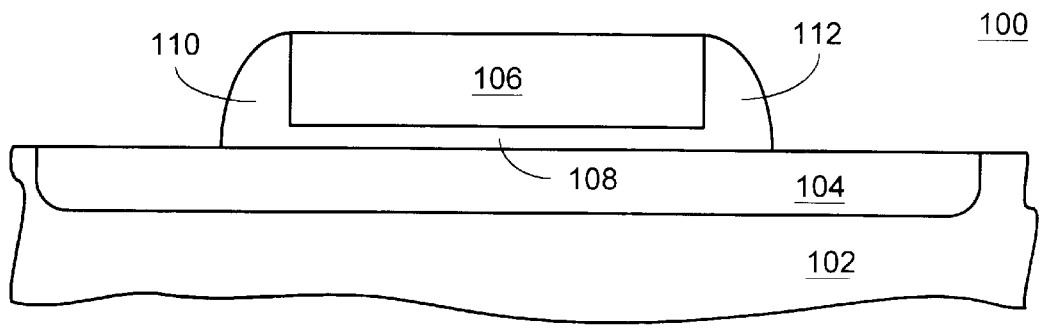
FIGS. 1A–1D show a portion of a prior art semiconductor device having a floating gate, a gate protect oxide layer and a barrier layer.
Figure 1:
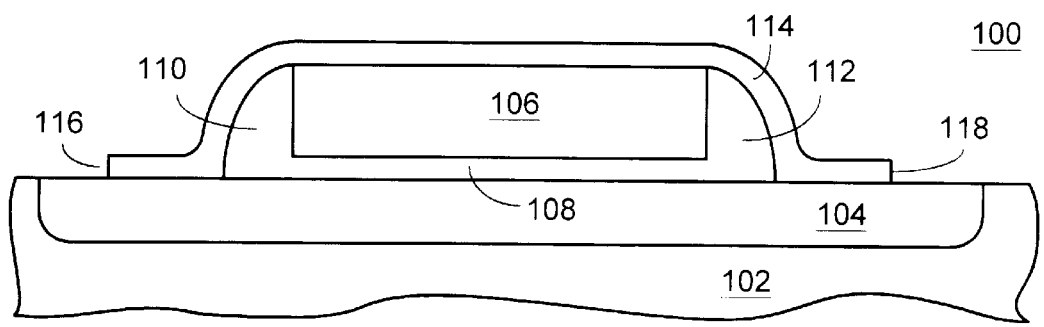
Figure 1:
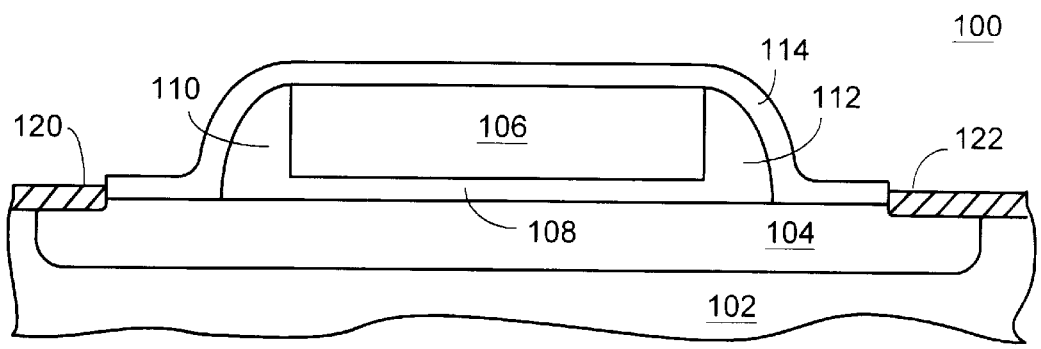
Figure 1:
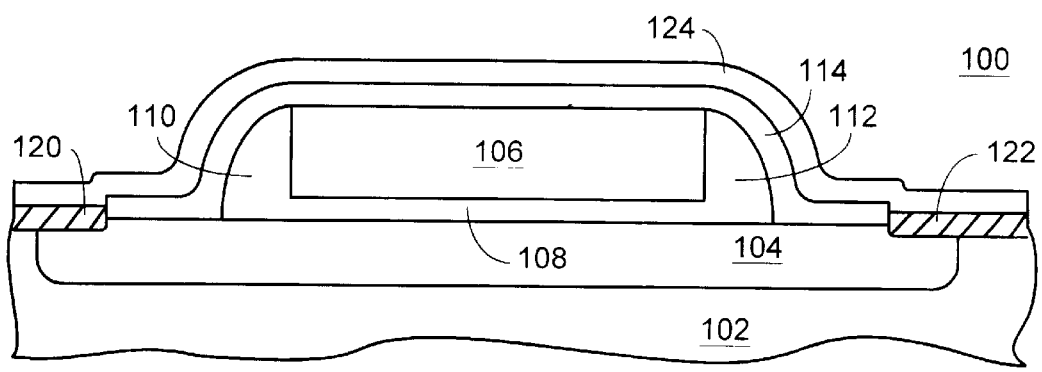

FIGS. 1A–1D show the structure and selected steps in a method of making a prior art semiconductor device 100 having a floating gate. Such a device could be used, for example, in a nonvolatile memory cell. Like numerical designations are used in each of the subsequent figures for like elements. FIG. 1A shows a semiconductor substrate 102 having a program junction region 104 formed in the semiconductor substrate 102. The floating gate 106 is separated from the program junction region 104 by a layer of gate oxide 108. The sidewall spacers 110 and 112 are formed on each side of the floating gate 106.

FIG. 1B shows the semiconductor device 100 as shown in FIG. 1A with a thin gate protect oxide layer 114 formed on the structure 100. The gate protect oxide layer 114 utilized in the prior art is typically an undoped oxide layer having a thickness of approximately 300 Angstroms and is utilized to protect portions of the device from forming a salicide (self-aligned suicide) layer in a subsequent step. The gate protect oxide layer 114 is shown etched away at 116 and 118 to allow salicide layers to form in areas not protected by the gate protect oxide layer 114.

FIG. 1C shows the semiconductor device 100 as shown in FIG. 1B showing salicide layers 120 and 122. The salicide layers are typically titanium silicide, $TiSi_2$ or cobalt silicide, $CoSi_2$.

FIG. 1D shows the semiconductor device 100 as shown in FIG. 1C with a barrier layer 124 formed on the semiconductor device 100. The barrier layer 124 in the prior art is typically a plasma deposited silicon oxynitride or nitride. A process to form such a layer is a PECVD (plasma enhanced chemical vapor deposition) at approximately 400° C.

Figure 2:
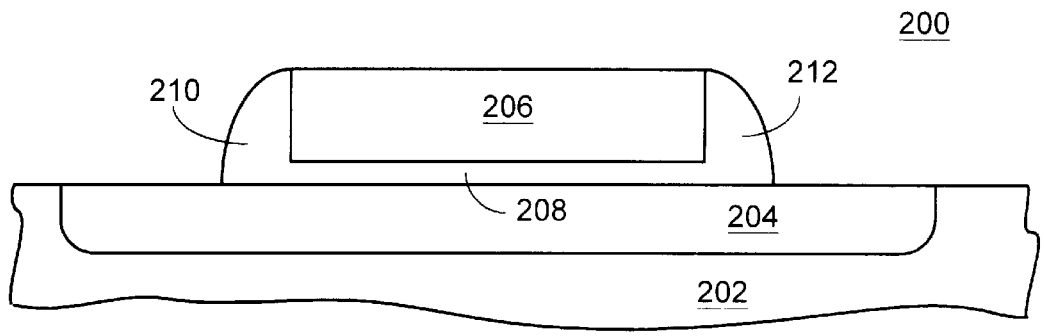
FIGS. 2A–2G show a portion of a semiconductor device manufactured in accordance with the present invention having a floating gate, a gate protect oxide layer, a barrier layer formed over the entire semiconductor device.
Figure 2:
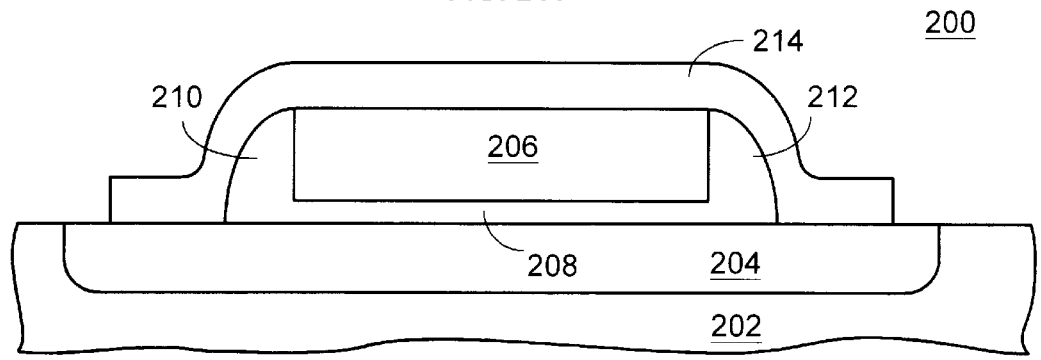
Figure 2:
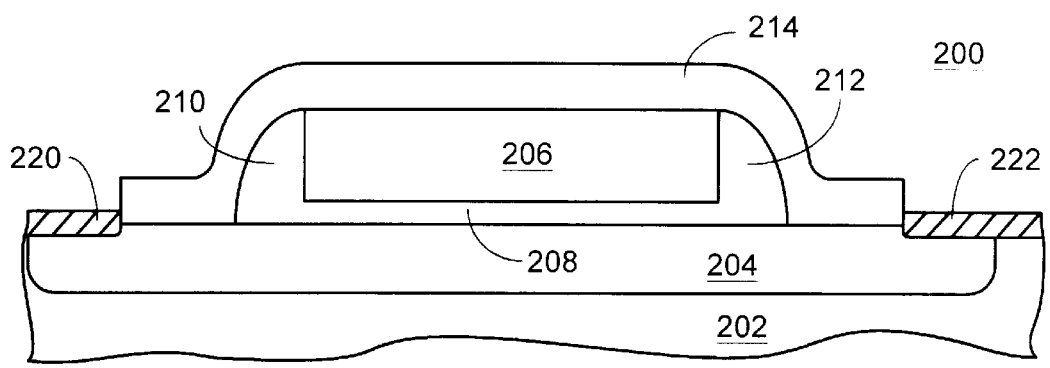
Figure 2:
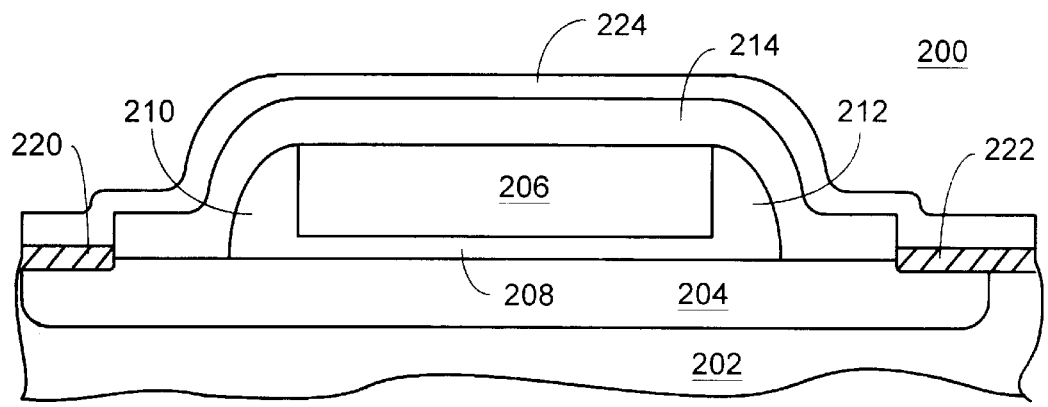
Figure 2:
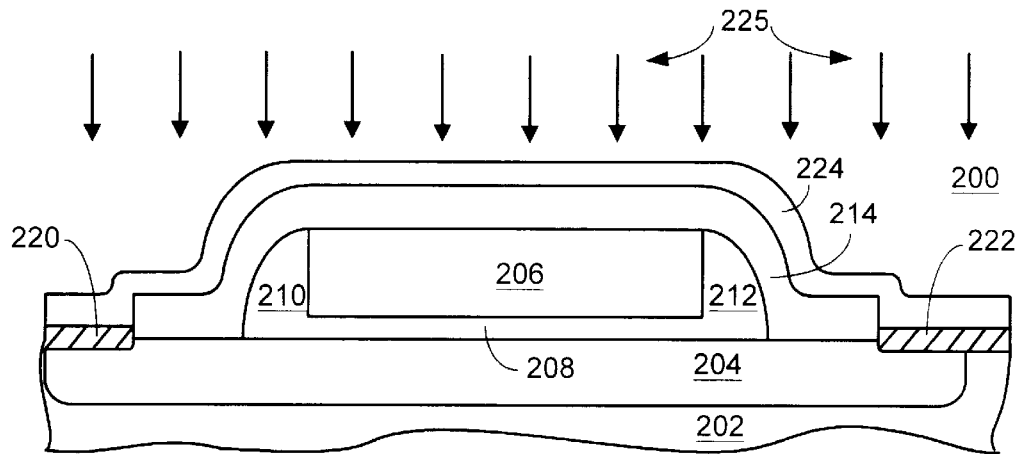
Figure 2:
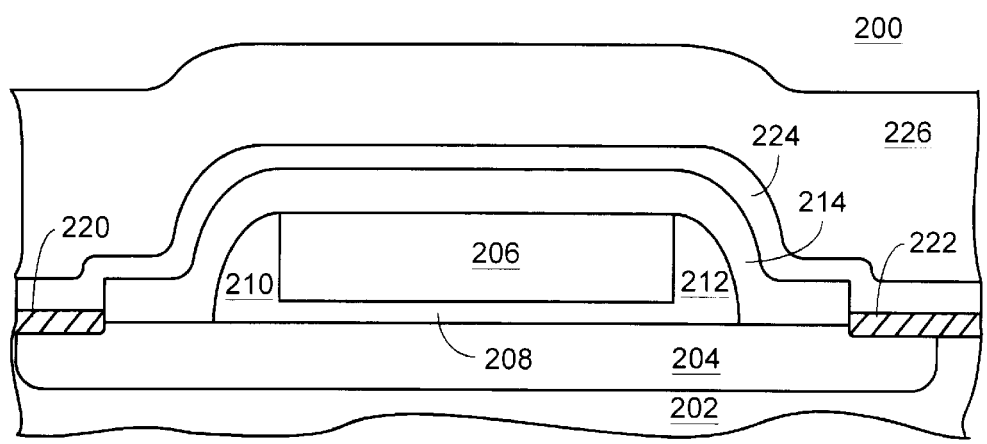
Figure 2:
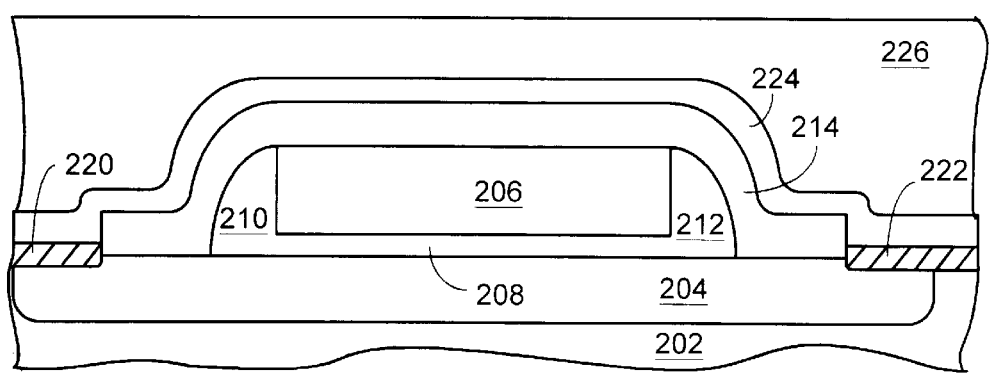

FIGS. 2A–2G show the structure and selected steps in a method of making a semiconductor device 200 having a substantially hydrogen-free floating gate in accordance with the present invention. Like numerical designations are used in each of the subsequent figures for like elements. FIG. 2A shows a semiconductor substrate 202 having a program junction region 204 formed in the semiconductor substrate 202. The program junction region 204 can be formed by the implantation of appropriate ions into the substrate 202. The floating gate 206 is separated from the program junction region 204 by a layer of gate oxide 208. The sidewall spacers 210 and 212 are formed on each side of the floating gate 206.

FIG. 2B shows the semiconductor device 200 as shown in FIG. 2A with a hydrogen getter layer 214. The hydrogen getter layer 214 is a P-doped (phosphorus-doped) film such as a PSG (phosphosilicate glass) film, a BPSG (borophosphosilicate glass) film, a PTEOS (phosphorus doped tetraethyl orthosilicate) deposited oxide film, or a BPTEOS (borophosphorus doped tetraethyl orthosilicate) deposited film. The purpose of the hydrogen getter layer 214 is to getter any mobile hydrogen ions present in the semiconductor device 200 to keep the hydrogen ions from contaminating the floating gate. The hydrogen getter layer 214 is preferably formed having a thickness of 1000–2000

Angstroms. The hydrogen getter layer 214 is shown etched away at 216 and 218 to allow salicide layers to form in areas not protected by the P-doped film 214.

FIG. 2C shows the semiconductor device 200 as shown in FIG. 2B showing the salicide layers 220 and 222. The salicide layers are typically titanium silicide, $TiSi_2$, or cobalt silicide, $CoSi_2$. Methods of forming salicide layers are well known in the semiconductor manufacturing art and will not be discussed.

FIG. 2D shows the semiconductor device 200 as shown in FIG. 2C with an amorphous silicon or polysilicon layer 224 formed on the device 200.

FIG. 2E shows the semiconductor device 200 as shown in FIG. 2D with the amorphous silicon or polysilicon layer 224 being implanted with nitrogen, indicated by arrows 225. The arrows 225 indicate either nitrogen atoms or nitrogen ions being implanted into the amorphous silicon or polysilicon layer 224. The amorphous silicon or polysilicon is deposited at a thickness of approximately 600 Angstroms. The nitrogen is implanted at a dosage of approximately 1E14 atoms or ions per centimeter squared and at an implant energy level in the range of 20–30 KeV. After the implantation of the nitrogen the device is thermally annealed, preferably by a rapid thermal anneal (RTA). Because amorphous silicon or polysilicon can be partially conductive, the nitrogen causes the amorphous silicon or polysilicon to be nonconductive.

FIG. 2F shows a dielectric layer 226 formed on the semiconductor device 200. The dielectric layer 226 is formed on the entire semiconductor chip.

FIG. 2G shows the dielectric layer 226 planarized to provide a smooth flat surface on which the next layer is formed.

Figure 3:
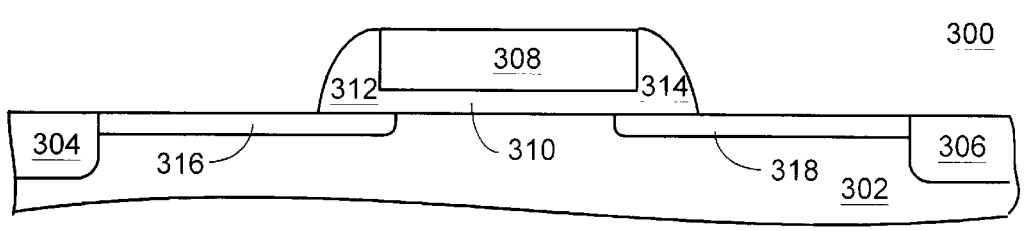
FIGS. 3A–3I show a portion of a prior art semiconductor device having a tungsten damascene local interconnect (LI), with the gate protect oxide layer removed to allow salicide layers to be formed on the semiconductor device, and a local interconnect barrier layer.
Figure 3:
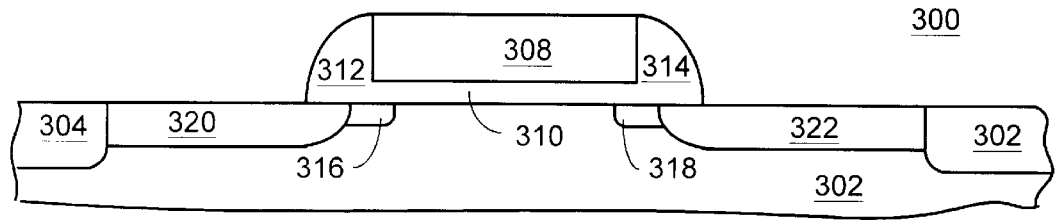
Figure 3:
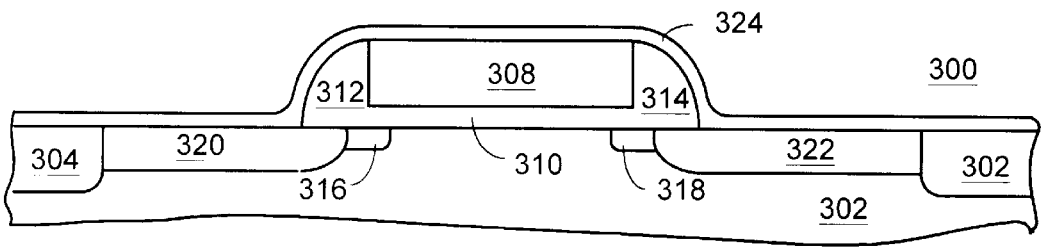
Figure 3:
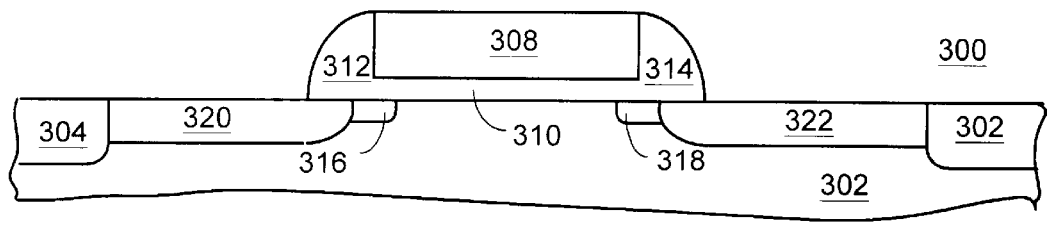
Figure 3:
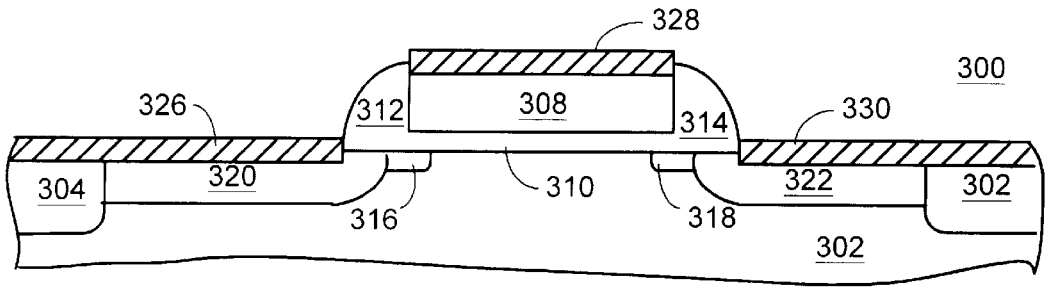
Figure 3:
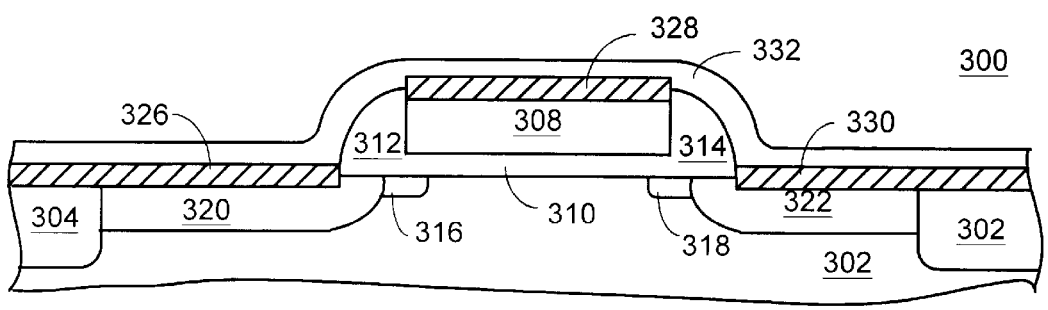
Figure 3:
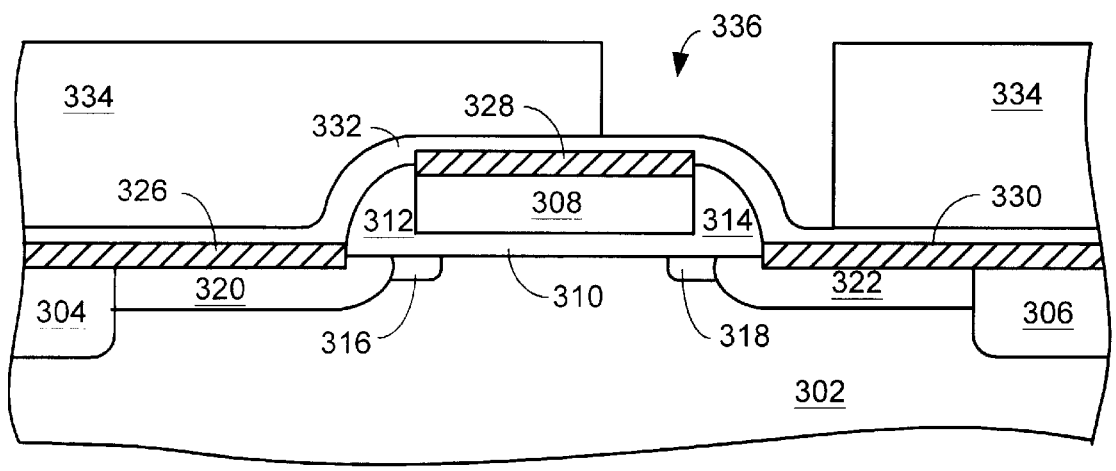
Figure 3:
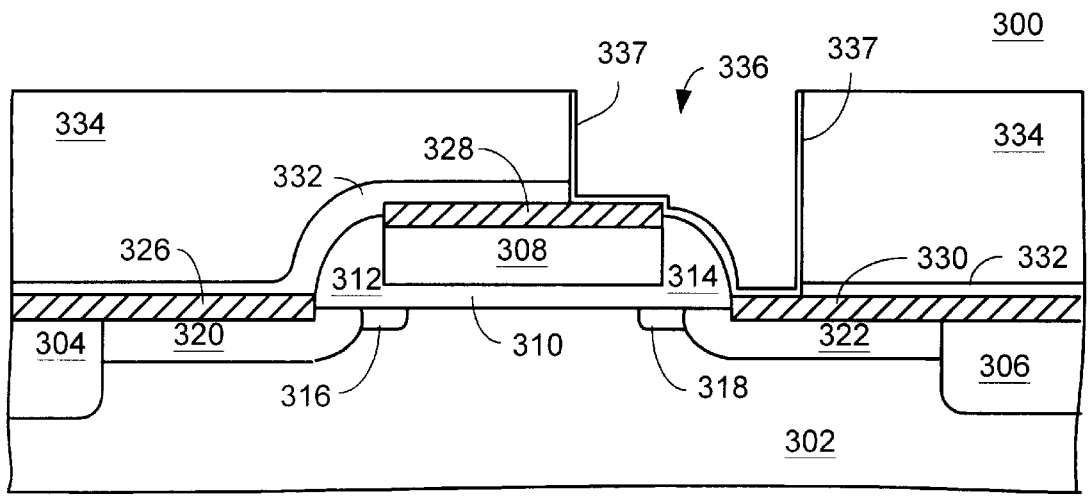
Figure 3:
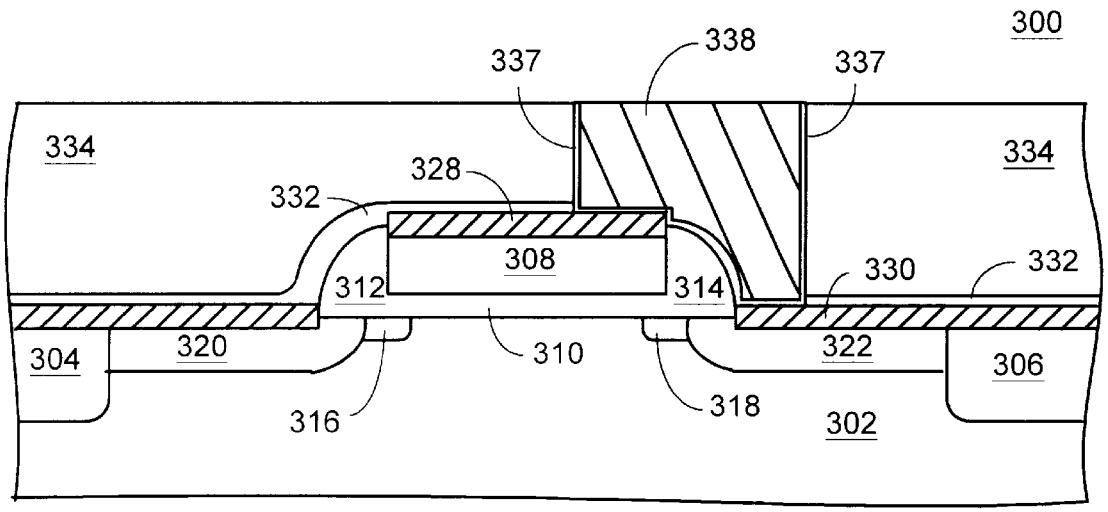

FIGS. 3A–3I show the structure and selected steps in a method of making a prior art semiconductor device 300. Like numerical designations are used in each of the subsequent figures for like elements. It should be appreciated that the device 300 shown in FIGS. 3A–3I is typically manufactured on a chip that also includes other semiconductor devices such as the semiconductor device 100 discussed in conjunction with FIGS. 1A–1D. FIG. 3A shows a portion of the semiconductor device 300 having a semiconductor substrate 302 with trench isolation regions 304 and 306. The trench isolation regions 304 and 306 can also be field oxide regions formed by a LOCOS process. The semiconductor device 300 has a gate 308, typically a polysilicon gate, separated from the semiconductor substrate 302 by a gate oxide layer 310 with sidewall spacers 312 and 314 formed on each side of the gate 308. Lightly doped drain (LDD) regions 316 and 318 are formed in the semiconductor substrate 302. The LDD regions 316 and 318 are typically formed by masking regions of the semiconductor device 300 and implanting selected ions into the substrate 302. Ions that can be used to form the LDD regions 316 and 318 are phosphorous ions at a dosage of about 1E13 ions per centimeter squared. The formation of the LDD regions 316 and 318 is typically done before the formation of the sidewall spacers 312 and 314. The methods of implanting ions are well known in the art and will not be discussed.

FIG. 3B shows the prior art semiconductor device 300 shown in FIG. 3A with a source region 320 and a drain region 322 formed in the semiconductor substrate 302. The formation of the source and drain regions 320 and 322 is typically done by ion implantation of appropriate ions. The process of implanting ions to form source and drain regions in a semiconductor device is well known in the semiconductor manufacturing art and will not be discussed. The concentration of the implanted ions in the source and drain regions 320 and 322 is greater than the concentration of the implanted ions in the LDD regions 316 and 318 and thus, the LDD regions 316 and 318 are shown subsumed by the source and drain regions 320 and 322. Ions that are typically implanted into the source and drain regions 316 and 318 are arsenic ions at a dosage of about 1E15 ions per centimeter squared. It should be appreciated that other ions can be used to form either the LDD regions or the source and drain regions.

FIG. 3C shows the prior art semiconductor device 300 shown in FIG. 3B with a gate protect oxide layer 324 formed over the entire surface of the semiconductor device 300. The gate protect oxide layer 324 in prior art devices is typically 300 Angstroms thick. The purpose of the gate protect oxide layer 324 is to protect selected areas of the device 300 from forming a salicide layer in a subsequent step of the manufacturing process. It should be appreciated that the portion of the device 300 shown in FIGS. 3A–3I is only one portion of the entire device and the gate protect oxide layer 324 can be formed over the entire surface of the device.

FIG. 3D shows the semiconductor device 300 shown in FIG. 3C after the gate protect oxide layer 324 has been removed.

FIG. 3E shows the prior art semiconductor device 300 shown in FIG. 3D with a salicide layer 326 formed on the source region 320, a salicide layer 328 formed on the gate region 308, and a salicide layer 330 formed on the drain region 322. The salicide is typically titanium silicide, TiSi2, or cobalt silicide, $CoSi_2$, and is formed by methods well known in the semiconductor manufacturing art and will not be discussed.

FIG. 3F shows the prior art semiconductor device 300 shown in FIG. 3E with a barrier layer 332 formed on the entire semiconductor device 300. The barrier layer 332 is typically a plasma silicon oxynitride or nitride film and the purpose of the barrier layer is to protect underlying features of a semiconductor device from being etched by the typical etch materials used to etch silicon dioxide.

FIG. 3G shows the prior art semiconductor device 300 shown in FIG. 3F with a dielectric layer 334 formed on the device 300. The dielectric layer 334 is shown etched to leave an opening, indicated at 336, that exposes a portion of the underlying device. A method of forming such an opening is to deposit or form a dielectric layer 334 on the entire semiconductor device 300 and then etch selected portions of the dielectric layer 334 to expose underlying regions of the semiconductor device 300. Typical materials that are used to etch the dielectric layer are $C_4F_8$ or a combination of $C_4F_8$ and $CH_3F$. The purpose of barrier layer 332 is to stop the etch materials used to etch the dielectric layer from etching the material underlying the dielectric layer. The purpose of the dielectric layer 334 is to electrically insulate the underlying portions of the device 300 from other elements that may be manufactured above the dielectric layer 334. As will be shown, the opening 336 allows electrical contact between selected portions of the underlying device 300 and selected portions of any device manufactured above the dielectric layer 334.

FIG. 3H shows a portion of the barrier layer 332 etched away after being exposed by the opening 336. As is known in the semiconductor manufacturing art, the process of forming interconnects is a two-step process. The first step is to selectively etch portions of the dielectric layer 334. Barrier layer 332 prevents the dielectric etch material from etching the materials underlying the barrier material. After the dielectric layer 332 is selectively etched, barrier layer 332 is then etched to expose selected areas of the underlying material. Barrier layer 332 is typically etched by an etch material such as $CH_3F$ & $O_2$. FIG. 3H also shows the surfaces of the opening 336 coated with an adhesion layer 337 such as titanium nitride or a combination of titanium and titanium nitride.

FIG. 3I shows the semiconductor device 300 with the opening 336 filled with a conductive material 338 after the adhesion layer 337 is formed on the surfaces of the opening 336. The semiconductor device 300 is typically planarized after the interconnect material 338 is formed so that the next layer can be manufactured on a smooth flat surface. Materials that are used for interconnects are conductive materials such as tungsten. The interconnect shown and described in FIGS. 3A–3I electrically connects the gate 308 to the drain region 322. As can be appreciated by one of ordinary skill in the art, the region indicated as being a drain region 322 could also be a source region and the gate could also be selected to be electrically connected to the source region of the device. As can also be appreciated, any combination of elements can be electrically connected, either on the same device or on other devices in the semiconductor device. It is also noted that the method of forming a dielectric layer, etching an opening in the dielectric layer, and filling the opening with a conductive material is known in the art as the damascene method.

FIGS. 4A–4I show the structure and the method of making a semiconductor device 400 in accordance with the present invention on which salicide layers are to be formed. Like numerical designations are used in each of the subsequent figures for like elements. It should be appreciated that the semiconductor device 400 is a portion of a semiconductor chip and can be manufactured on a chip that also includes other semiconductor devices such as the semiconductor device 200 described above in conjunction with FIGS. 2A–2E.

Figure 4:
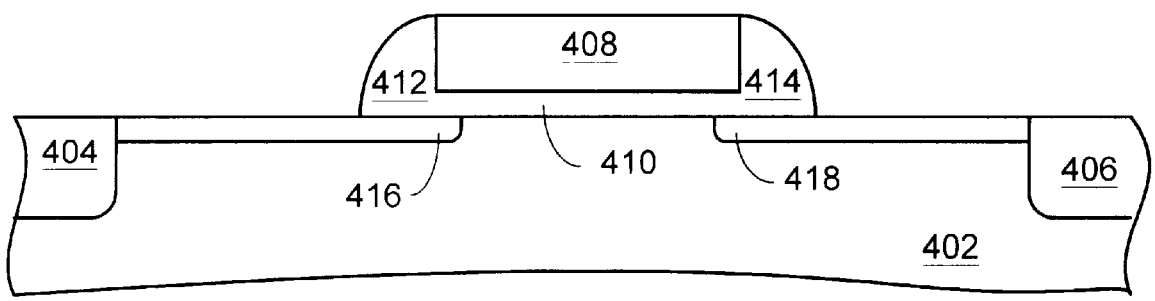
FIGS. 4A–4L show a portion of a semiconductor device manufactured in accordance with the present invention having a tungsten damascene local interconnect (LI) or an interconnect to a source or drain electrode.
Figure 4:
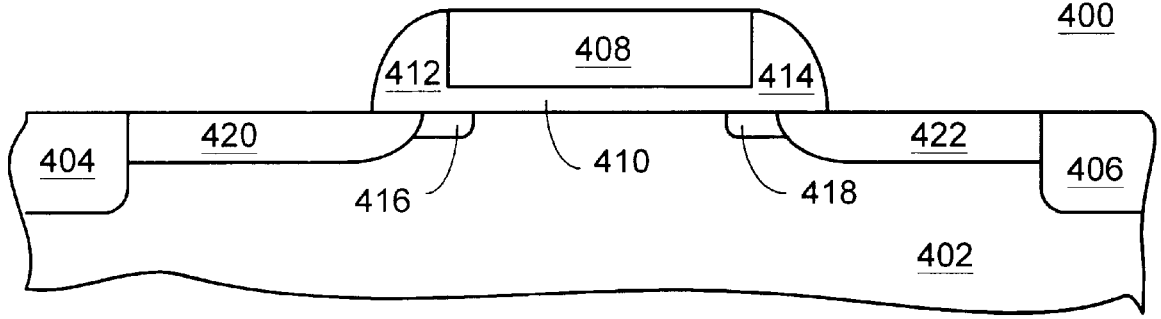
Figure 4:
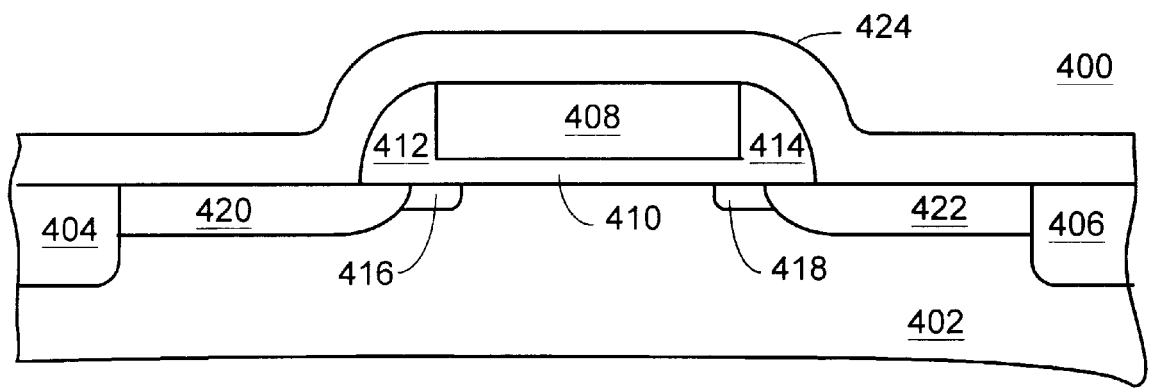
Figure 4:
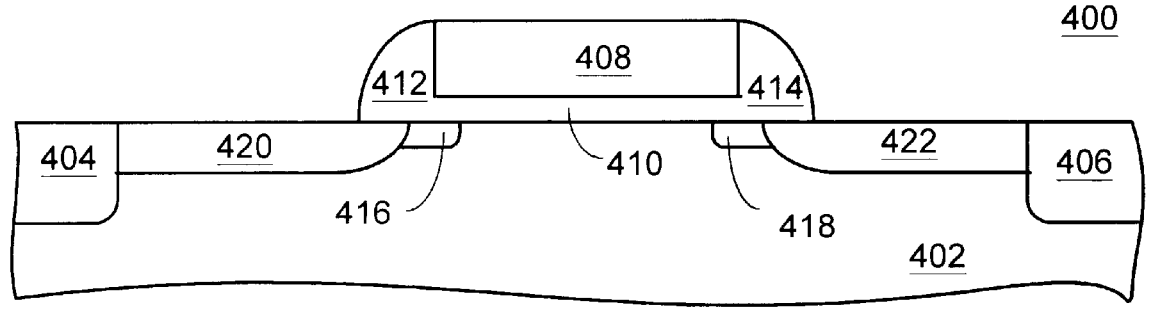
Figure 4:
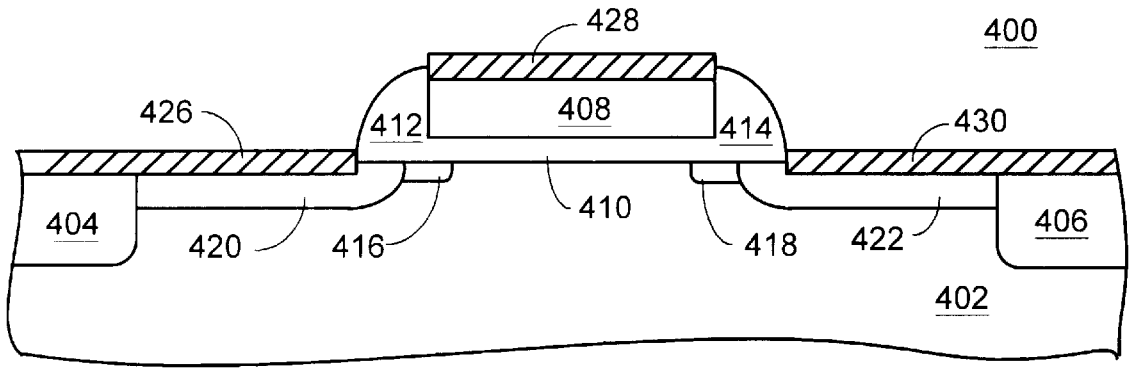
Figure 4:
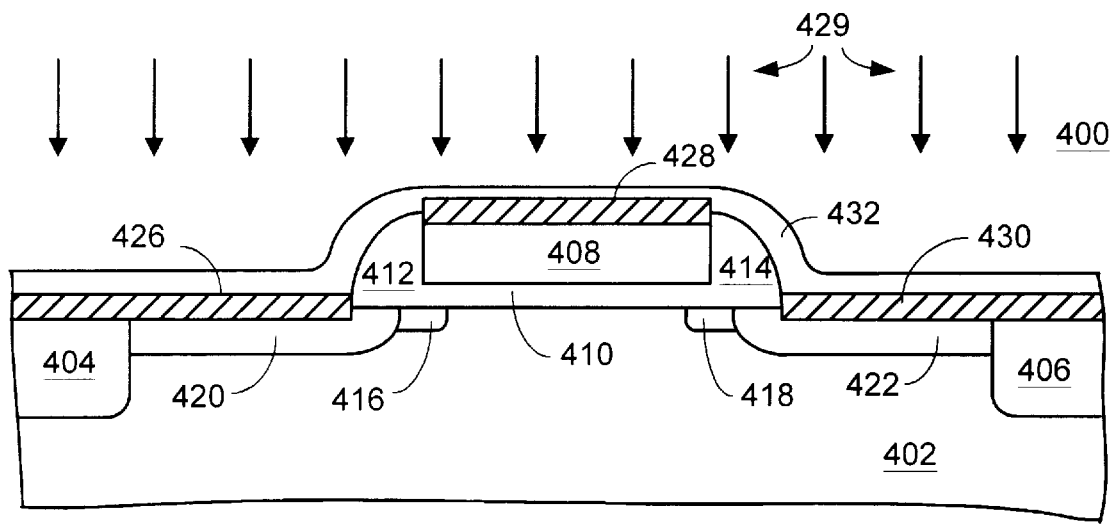
Figure 4:
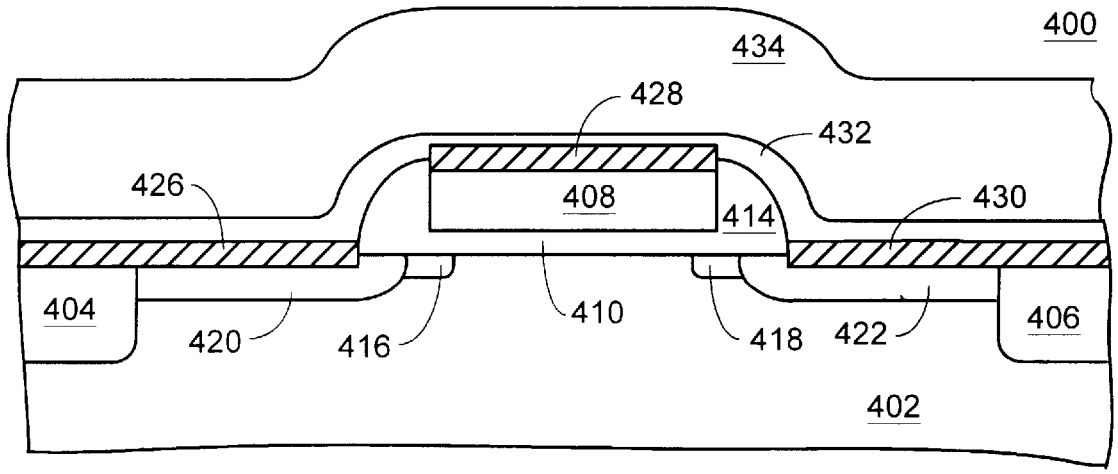
Figure 4:
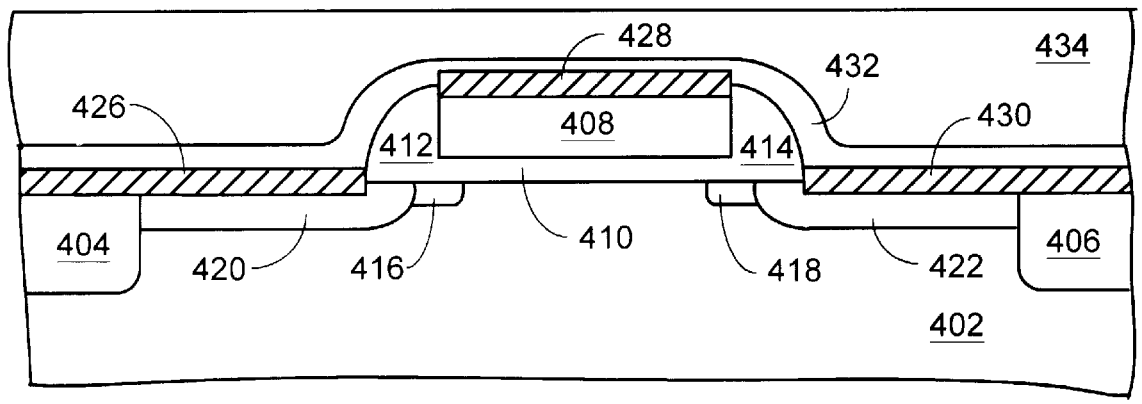
Figure 4:
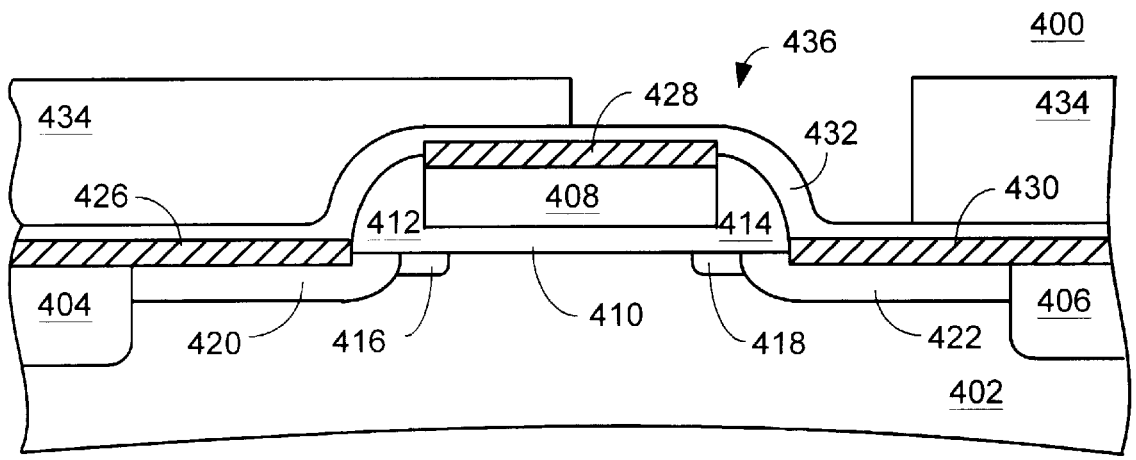
Figure 4:
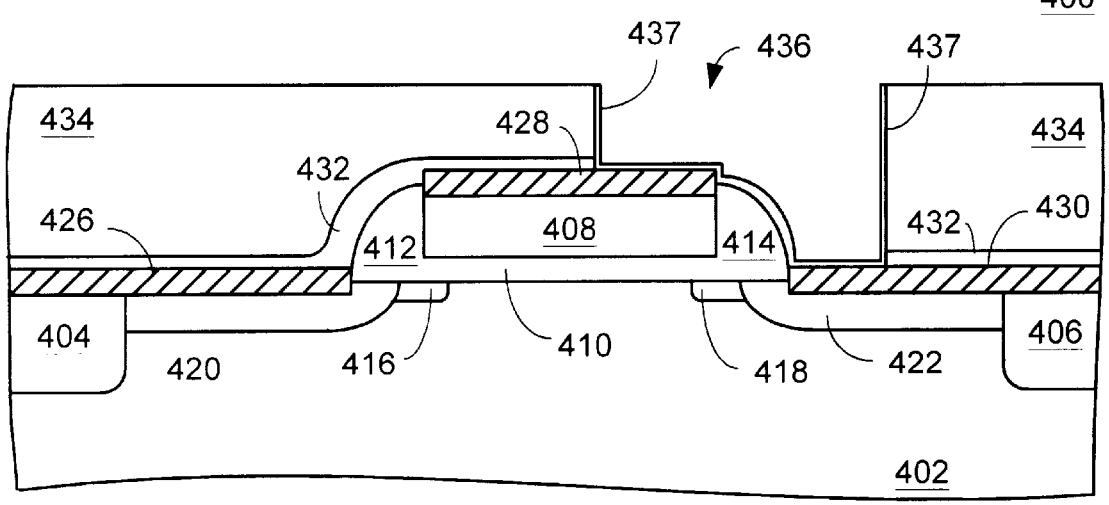
Figure 4:
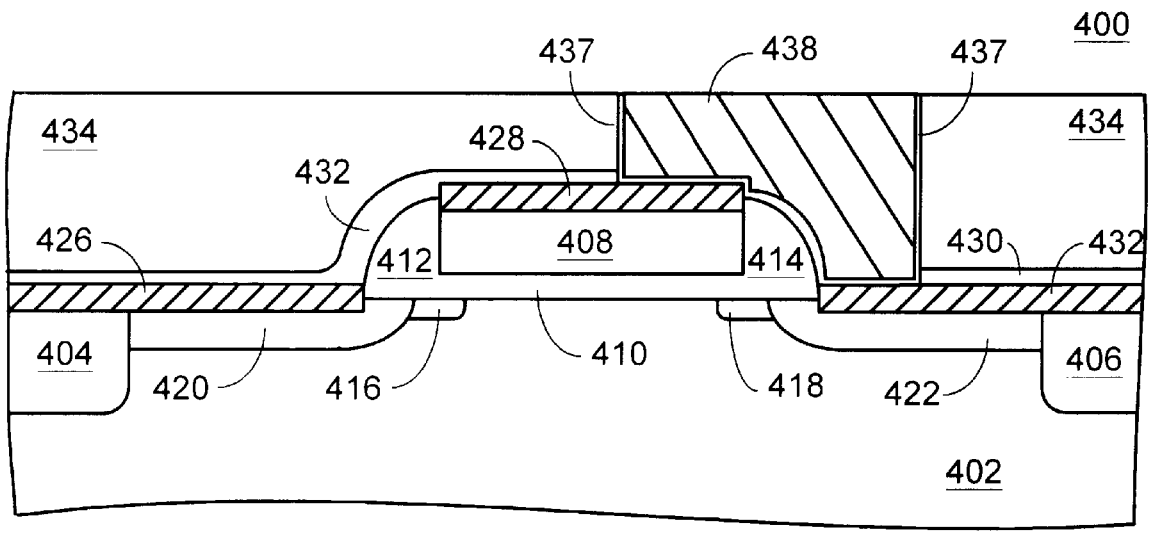
Figure 4:
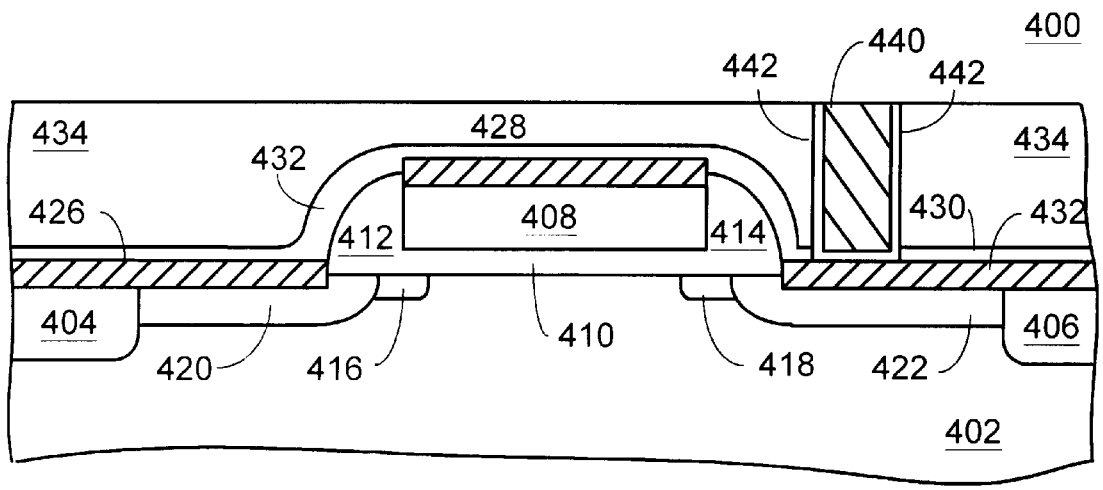

FIG. 4A shows a portion of the semiconductor device 400 manufactured on a semiconductor substrate 402 with trench isolation regions 404 and 406. The trench isolation regions 404 and 406 regions can also be field oxide regions manufactured by a LOCOS process. The semiconductor device 400 has a gate 408, typically a polysilicon gate, separated from the semiconductor substrate by a gate oxide layer 410 with the sidewall spacers 412 and 414 formed on each side of the gate 408. The lightly doped drain (LDD) regions 416 and 418 are formed in the semiconductor substrate 402. The LDD regions 416 and 418 are typically formed by masking regions of the device 400 and implanting selected ions into the substrate 402. The formation of the LDD regions is typically done before the formation of the sidewall spacers 412 and 414. Ions that can be used to form LDD regions are phosphorous ions at a dosage of about 1E13 ions per centimeter squared. The methods of implanting ions are well known in the semiconductor manufacturing art and will not be discussed.

FIG. 4B shows the semiconductor device 400, as shown in FIG. 4A, with a source region 420 and a drain region 422 formed in the semiconductor substrate 402. The formation of the source and drain regions 420 and 422 is typically done by ion implantation of appropriate ions and is well known in the semiconductor manufacturing art and will not be discussed. The concentration of the implanted ions in the source and drain regions 420 and 422 is greater than the concentration of the implanted ions in the LDD regions 416 and 418 and thus, the LDD regions 416 and 418 are shown subsumed by the source and drain regions 420 and 422. Ions that are typically implanted into the source and drain regions 416 and 418 are arsenic ions at a dosage of about 1E15 ions per centimeter squared. It should be appreciated that other ions can be used to form either the LDD regions or the source and drain regions.

FIG. 4C shows the semiconductor device 400 with a hydrogen getter layer 424 formed over the entire surface of the device 400. The hydrogen getter layer 424 is a film such as a PSG (phosphosilicate glass) film, a BPSG (borophosphosilicate glass) film, a PTEOS (phosphorus doped tetraethyl orthosilicate) deposited oxide film, or a BPTEOS (borophosphorus-doped tetraethyl orthosilicate) deposited oxide film. The hydrogen getter layer 424 has a thickness between 1000 and 2000 Angstroms. The purpose of the hydrogen getter layer 424 is to getter mobile hydrogen and, in addition, the hydrogen getter layer protects underlying areas from forming salicide layers in subsequent processing steps. The portion of the device 400 shown in FIGS. 4A–4L is only one portion of the entire device and the hydrogen getter layer 424 is formed over the entire surface of the entire device. FIG. 4D shows the device 400 with the hydrogen getter layer 424 removed from the portion of the device shown in FIGS. 4A–4L. The hydrogen getter layer 424 is removed from this portion of the device 400 because it is intended that selected portions of the device 400 will form salicide layers. The hydrogen getter layer 424 is not removed from portions of the device 400 that are not to form a salicide layer.

FIG. 4E shows the semiconductor device 400 with a salicide layer 426 formed on the source region 420, a salicide layer 428 formed on the drain region 422, and a salicide layer 430 formed on the gate region 408. The salicide layer is typically titanium silicide, $TiSi_2$, or cobalt silicide, $CoSi_2$, and is formed by methods well known in the semiconductor manufacturing art and will not be discussed.

FIG. 4F shows the semiconductor device 400 with barrier layer 432 formed on the entire semiconductor device 400. Barrier layer 432 is formed by depositing a layer of amorphous silicon or polysilicon with a thickness of approximately 600 Angstroms and implanting the layer of amorphous silicon or polysilicon with nitrogen, indicated by arrows 429. The nitrogen is implanted at a dosage of approximately 1E14 ions per centimeter squared at an implantation energy in the range of 20–30 KeV. The formation of barrier layer 432 corresponds to the formation of barrier layer 224 (FIG. 2E). Barrier layer 224 shown in FIG. 2E and barrier layer 432 are parts of the same barrier layer formed in different parts of the semiconductor device. The purpose of barrier layer 432 is to protect underlying features of the semiconductor device 400 from the typical etch materials used to etch silicon dioxide.

FIG. 4G shows the semiconductor device 400 with a dielectric layer 434 formed on the semiconductor device 400. The purpose of the dielectric layer 434 is to electrically insulate the underlying portions of the device 400 from other elements that may be manufactured above the dielectric layer 434.

FIG. 4H shows the semiconductor device 400 with the dielectric layer 434 planarized to provide a smooth surface for subsequent manufacturing processes.

FIG. 4I shows the semiconductor device 400 with an opening 436 etched in the dielectric layer 434. Openings, such as the opening 436, allow electrical contact between selected portions of one layer of the semiconductor device 400 and selected portions of any device manufactured above the dielectric layer 434 or allow electrical contact between selected elements on the same layer of the device 400.

FIG. 4J shows the portion of the barrier layer 432 exposed by the opening 436 etched away and an adhesion layer 437 formed on the surfaces of the opening 436.

FIG. 4K shows the opening 436 filled with a conductive material 438, such as tungsten, which electrically connects the gate 408 to the drain region 422. It is noted that the salicide is electrically conductive and the electrical contact is established through the salicide.

FIG. 4L shows an alternative embodiment wherein an opening etched in the dielectric layer 434 only exposes a portion of the drain region 422. The opening is filled with a conductive material such as tungsten. The electrical connection 440 to the drain region 422 is to connect the drain region 422 to another device or other devices in the same layer in the semiconductor device 400 or to another device or other devices in a different layer in the semiconductor device 400. The opening is coated with an adhesion layer 442.

Figure 5:
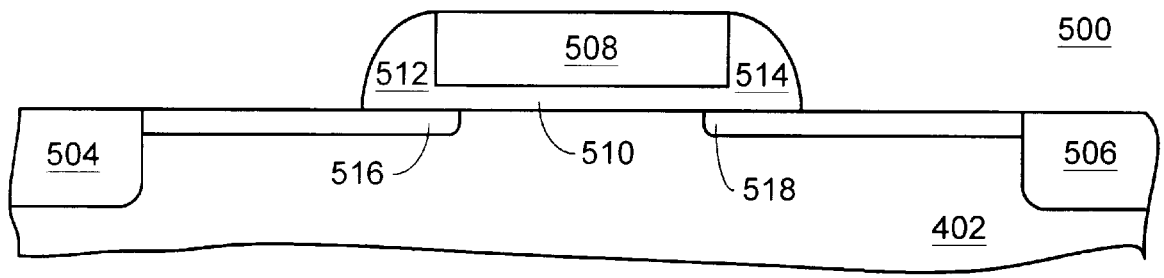
FIGS. 5A–5J show a portion of a semiconductor device manufactured in accordance with the present invention having a tungsten damascene local interconnect (LI) or an interconnect to a source or drain electrode.
Figure 5:
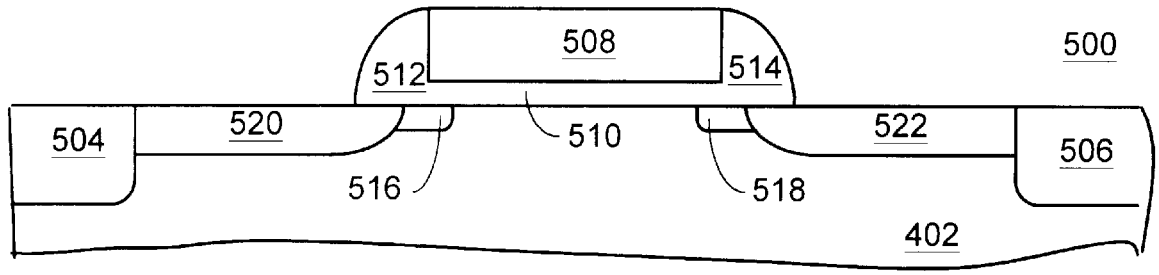
Figure 5:
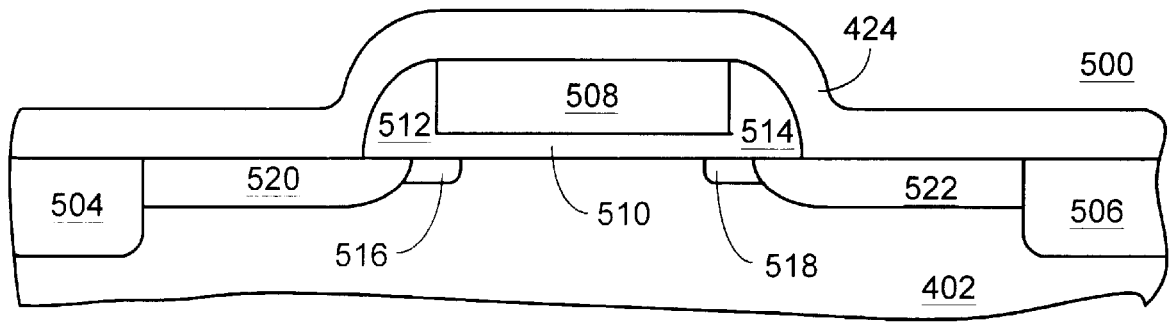
Figure 5:
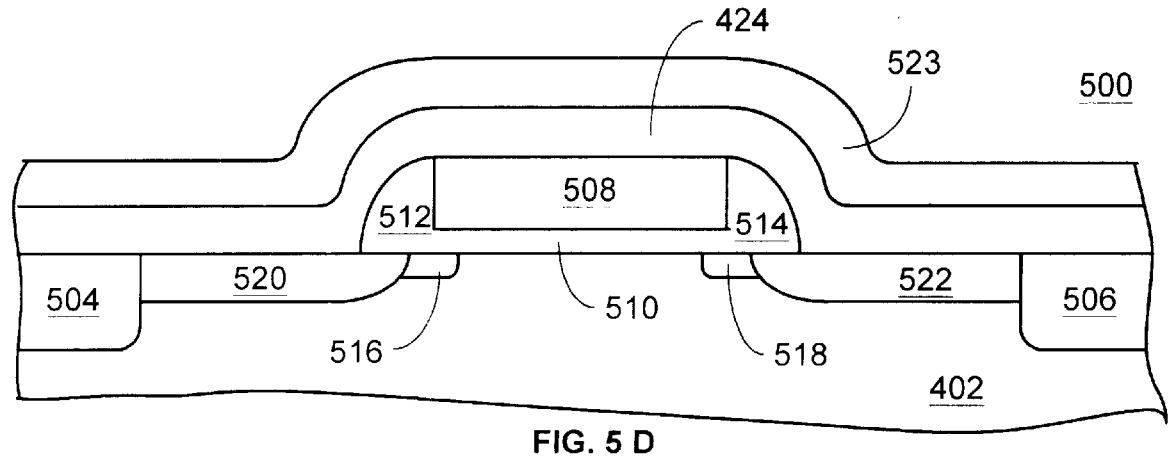
Figure 5:
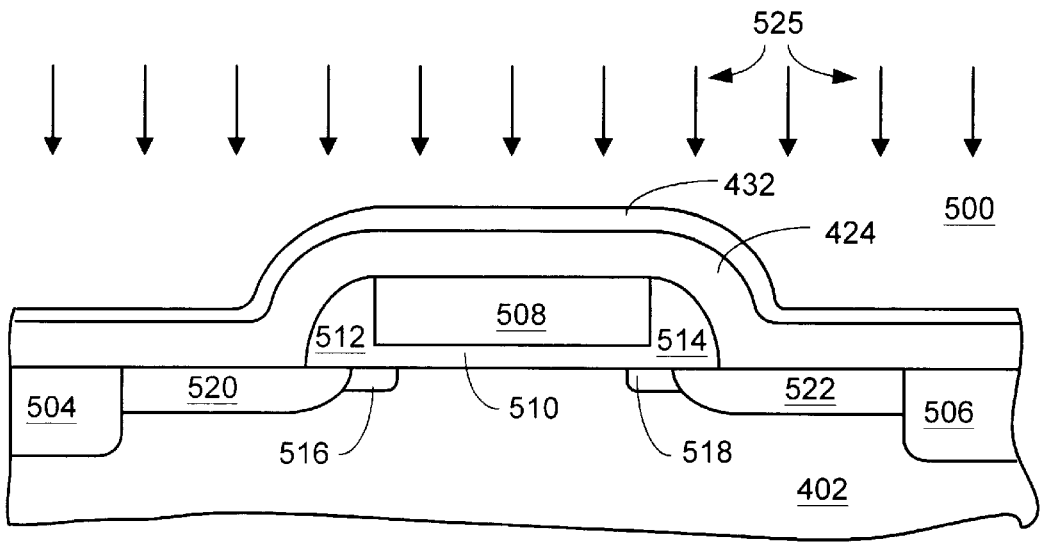
Figure 5:
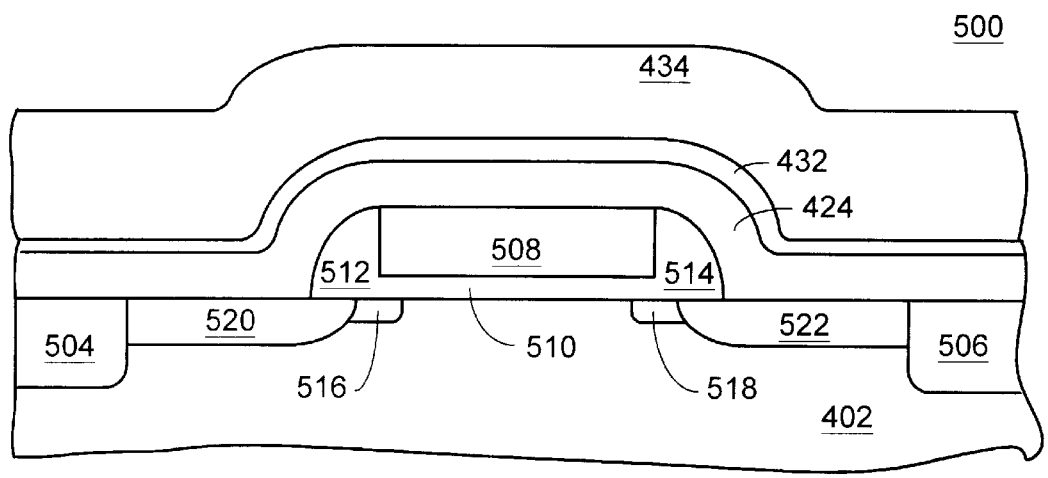
Figure 5:
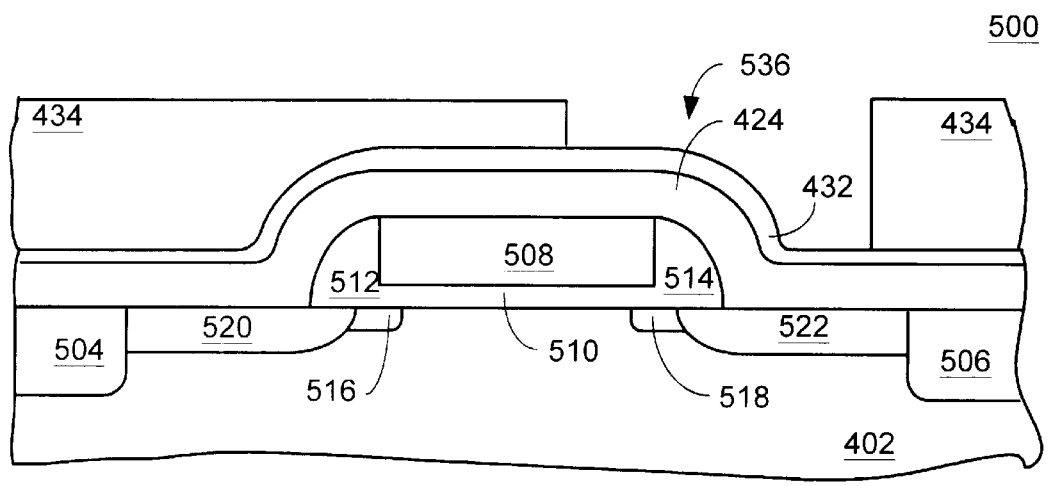
Figure 5:
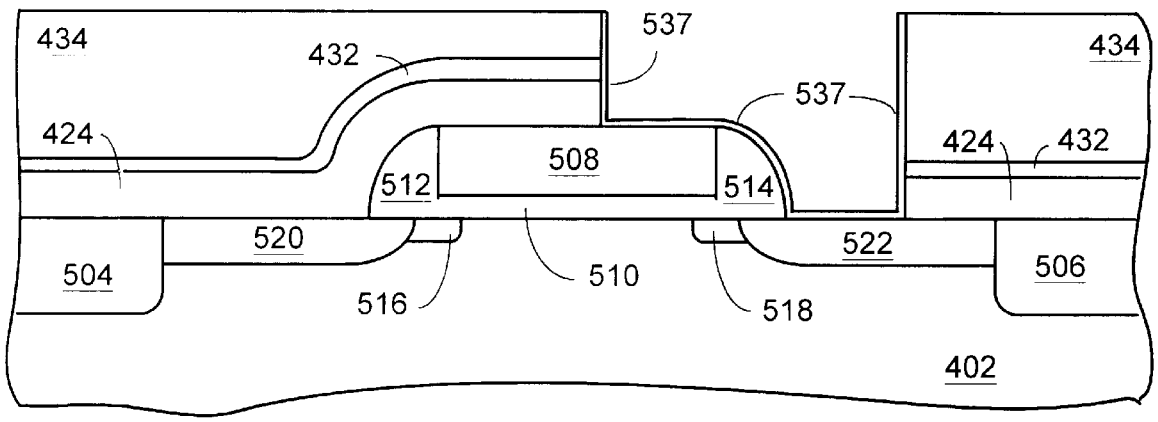
Figure 5:
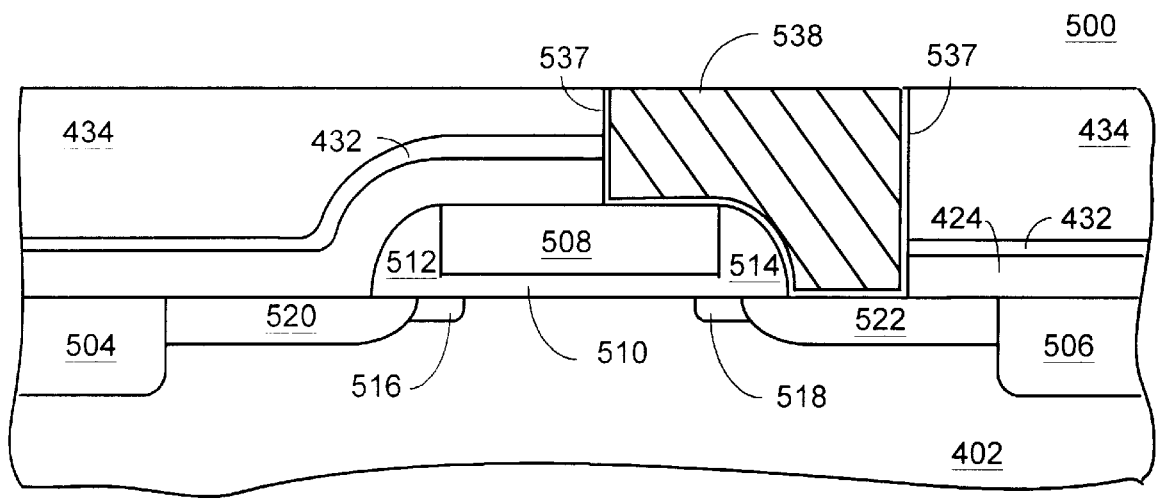
Figure 5:
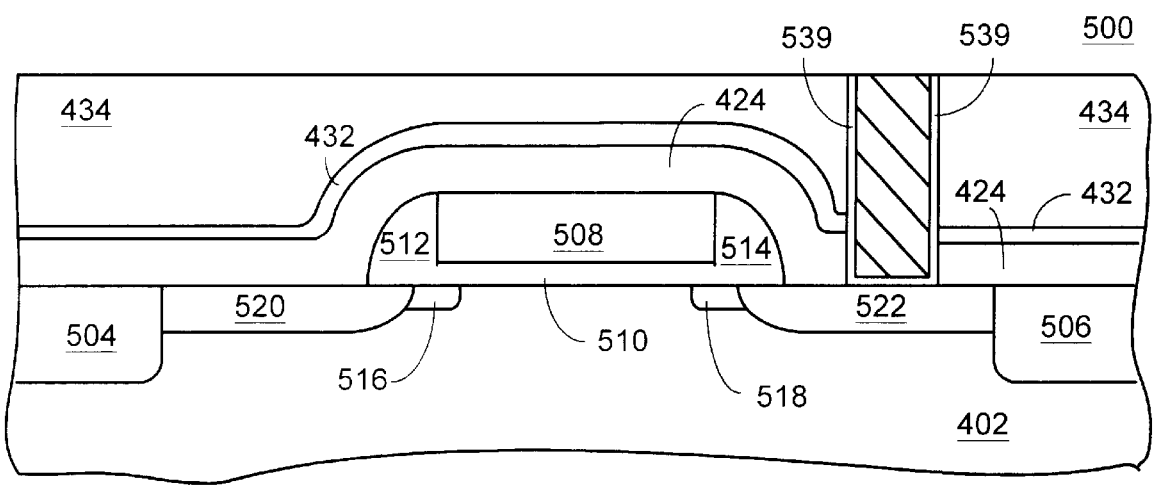

FIGS. 5A–5J show the structure and selected steps in a method of making a semiconductor device 500 in accordance with the present invention that does not have salicide layers. Like numerical designations are used in each of the figures for like elements. Like numerical designations are used in each of the FIGS. 5A–5J for like elements shown in FIGS. 4A–4L. FIG. 5A shows a portion of the semiconductor device 500 manufactured on the semiconductor substrate 402 with trench isolation regions 504 and 506. The trench isolation regions 504 and 506 can also be field oxide regions formed by a LOCOS process. The purpose of the trench isolation or the field oxide regions is to isolate an element from an adjacent region. The semiconductor device 500 has a gate 508, typically a polysilicon gate, separated from the semiconductor substrate by a gate oxide layer 510 with sidewall spacers 512 and 514 formed on each side of the gate 508. Lightly doped drain (LDD) regions 516 and 518 are formed in the semiconductor substrate 402. The LDD regions are typically formed as described above. The formation of the LDD regions is typically done before the formation of the sidewall spacers. Ions that can be used to form LDD regions are phosphorous ions at a dosage of about 1E13 ions per centimeter squared.

FIG. 5B shows the semiconductor device 500 shown in FIG. 5A with a source region 520 and a drain region 522 formed in the semiconductor substrate 502. The formation of the source and drain regions 520 and 522 is typically done by ion implantation of appropriate ions and is well known in the semiconductor manufacturing art and will not be discussed. The concentration of the implanted ions in the source and drain regions 520 and 522 is greater than the concentration of the implanted ions in the LDD regions 516 and 518 and thus, the LDD regions 516 and 518 are shown subsumed by the source and drain regions 520 and 522. Ions that are typically implanted into the source and drain regions 516 and 518 are arsenic ions at a dosage of about 1E15 ions per centimeter squared.

FIG. 5C shows the device 500 with a hydrogen getter layer 424 formed over the entire surface of the device 500. The hydrogen getter layer 424 formed over the device 500 is the same hydrogen getter layer 424 that is formed over the device 400 discussed in conjunction with FIGS. 4A–4I. As discussed above, the hydrogen getter layer 424 is a film such as a PSG (phosphosilicate glass) film, a BPSG (borophosphosilicate glass) film, a PTEOS (phosphorus doped tetraethyl orthosilicate) deposited oxide film, or a BPTEOS (borophosphorus doped tetraethyl orthosilicate) deposited oxide film. The hydrogen getter layer 424 has a thickness between 1000–2000 Angstroms. The purpose of the hydrogen getter layer 424 is to getter hydrogen and, in addition, to protect underlying areas from forming salicide layers in subsequent processing steps.

FIG. 5D shows etch protect layer 523 formed on the device 500 to protect underlying portions of the semiconductor device from being etched by the etch materials used to etch materials in other portions of the semiconductor device.

FIG. 5E shows the device 500 with the protect layer 523 removed and a barrier layer 432 formed on the device 500. The barrier layer 432 is formed on the entire device. The barrier layer 432, as described above, is formed by depositing a layer of amorphous silicon or polysilicon and implanting nitrogen, indicated by arrows 525. As described above, the nitrogen is implanted at a dosage of approximately 1E14 ions per centimeter squared at an implant energy in the range of 20–30 KeV. Barrier layer 432 is used to protect underlying features of the device 500 from the typical etch materials used to etch silicon dioxide.

FIG. 5F shows the device 500 with a dielectric layer 434 that has been formed on the entire semiconductor device as well as the semiconductor device 500.

FIG. 5G shows the dielectric layer 434 planarized and an opening, indicated at 536, etched to expose a selected portion of the underlying device. The purpose of the dielectric material 434 is to electrically insulate the underlying portions of the device 500 from other elements that may be manufactured above the dielectric layer 434. The purpose of the opening 536 is to allow an electrical connection to the exposed portion of the underlying portion of the device 500.

FIG. 5H shows that the portion of the barrier layer 432 exposed by the opening 536 has been etched away and an adhesion layer 537 formed on the surfaces of the opening 536.

FIG. 5I shows the opening 536 filled with a conductive material 538, such as tungsten, which electrically connects the gate 508 to the drain region 522.

FIG. 5J shows an alternative embodiment with an electrical connection 540 that is to connect the drain region 522 to another device either on the same layer or on a different layer. The electrical connection 540 is formed by the method described above, that is, by etching an opening in the dielectric layer 434, forming an adhesion layer 539, and filling the opening with a conductive material, such as tungsten.

Figure 6:
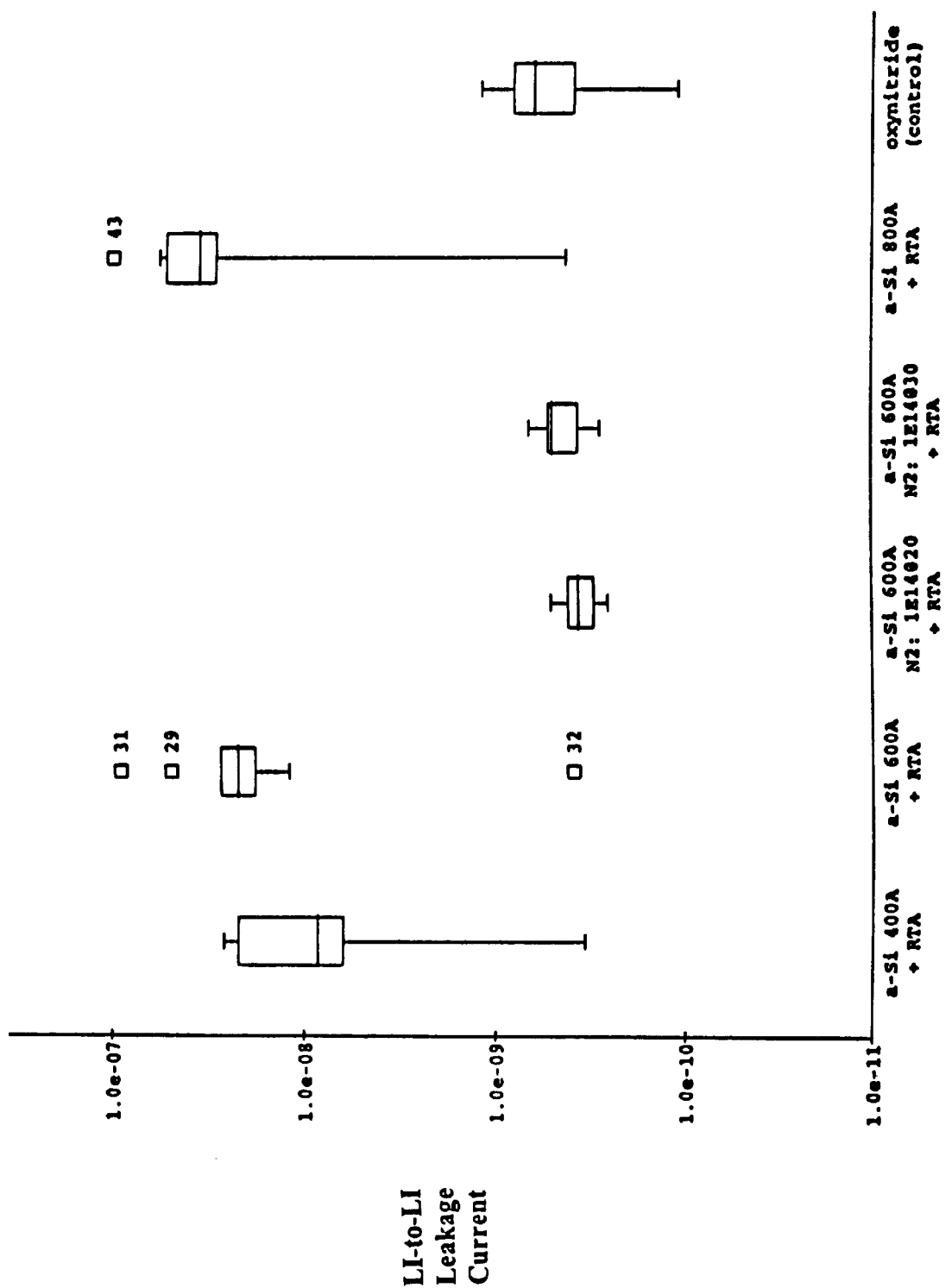
FIG. 6 is a diagram showing experimental measurements taken from devices manufactured with various phosphorus implant dosages.

FIG. 6 is a diagram showing experimental test results showing LI-to-LI (local interconnect-to-local interconnect) leakage current for various configurations of the barrier layer. The purpose of the tests was to determine the insulating properties of the nitrogen implanted amorphous silicon or polysilicon. The test results for each configuration are compared to a configuration having a normal barrier layer formed of oxynitride. The results show that devices with barrier layers formed of amorphous silicon with a thickness of 600 Angstroms and implanted with nitrogen at a dosage of 1E14 ions per centimeter squared and at an implant energy of either 20 or 30 KeV have the same, or better, insulating properties as the oxynitride control device.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim:

1. A semiconductor device, comprising:
 a semiconductor substrate;
 at least one type of device in the semiconductor substrate;
 a nitrogen doped barrier layer on the at least one type of device, wherein the nitrogen doped barrier layer is selected from the group of nitrogen doped barrier layer of amorphous silicon and a nitrogen doped barrier layer of polysilicon; and
 a hydrogen getter layer under the nitrogen doped barrier layer.

2. The semiconductor device of claim 1, wherein the hydrogen getter layer comprises a P-doped film.

3. The semiconductor device of claim 2, wherein the hydrogen getter layer comprises a material selected from the group of a PSG film, a BPSG film, a PTEOS deposited film and a BPTEOS deposited oxide film.

4. The semiconductor device of claim 3, wherein the at least one type of device is a nonvolatile memory device having a floating gate.

5. The semiconductor device of claim 4, further comprising a program junction in the semiconductor substrate underlying the floating gate.

6. The semiconductor device of claim 3, wherein the at least one type of device is a MOSFET.

7. The semiconductor device of claim 6, further comprising LDD regions in the semiconductor substrate.

8. The semiconductor device of claim 7, further comprising a source region and a drain region in the semiconductor substrate.

9. The semiconductor device of claim 7, further comprising salicide layers in regions of the semiconductor device where the hydrogen getter layer has been removed.

10. The semiconductor device of claim 9, further comprising a tungsten damascene interconnect electrically connected to a first element of the MOSFET and a second element of the MOSFET.

11. The semiconductor device of claim 10, further comprising a dielectric layer on the semiconductor device.

12. The semiconductor device of claim 11, further comprising an opening in the dielectric layer that exposes a portion of the gate and a portion of one of either the drain or source region and wherein an adhesion layer is in the opening and the opening is filled with tungsten.

* * * * *